United States Patent
Takahashi et al.

(10) Patent No.: US 11,914,009 B2
(45) Date of Patent: Feb. 27, 2024

(54) NMR APPARATUS AND GAS REPLACEMENT METHOD FOR REPLACING GAS IN NMR PROBE

(71) Applicants: JEOL Ltd., Tokyo (JP); OSAKA UNIVERSITY, Osaka (JP)

(72) Inventors: Hiroki Takahashi, Tokyo (JP); Yuki Endo, Tokyo (JP); Toshimichi Fujiwara, Osaka (JP); Yoh Matsuki, Osaka (JP)

(73) Assignees: JEOL Ltd., Tokyo (JP); OSAKA UNIVERSITY, Osaka (JP)

( * ) Notice: Subject to any disclaimer, the term of this patent is extended or adjusted under 35 U.S.C. 154(b) by 0 days.

(21) Appl. No.: 17/885,894

(22) Filed: Aug. 11, 2022

(65) Prior Publication Data
US 2023/0047563 A1  Feb. 16, 2023

(30) Foreign Application Priority Data
Aug. 12, 2021  (JP) .................................. 2021-131777

(51) Int. Cl.
  *G01R 33/30* (2006.01)
(52) U.S. Cl.
  CPC .......... *G01R 33/307* (2013.01); *G01R 33/30* (2013.01); *G01R 33/305* (2013.01)
(58) Field of Classification Search
  CPC .... G01R 33/30; G01R 33/305; G01R 33/307; G01R 33/31
  See application file for complete search history.

(56) References Cited

U.S. PATENT DOCUMENTS

| | | | |
|---|---|---|---|
| 5,635,840 A | 6/1997 | Horigane et al. | |
| 6,128,918 A * | 10/2000 | Deaton | A61K 49/1815 62/919 |
| 7,633,290 B1 * | 12/2009 | Al-Khalidy | G01R 33/20 324/309 |
| 2006/0176056 A1 | 8/2006 | Doty et al. | |
| 2008/0242974 A1 * | 10/2008 | Urbahn | G01R 33/31 600/420 |
| 2008/0297157 A1 * | 12/2008 | Hu | G01N 24/08 324/321 |
| 2015/0168518 A1 | 6/2015 | Hirose et al. | |

(Continued)

FOREIGN PATENT DOCUMENTS

| | | |
|---|---|---|
| JP | H08240651 A | 9/1996 |
| JP | 201063884 A | 3/2010 |

(Continued)

OTHER PUBLICATIONS

Quantum Design, Magnetic Property Measurement System, MPMS 3 User's Manual, Jun. 2016 (Year: 2016).*

(Continued)

*Primary Examiner* — Steven L Yeninas
(74) *Attorney, Agent, or Firm* — The Webb Law Firm (57) ABSTRACT

An NMR apparatus includes a depressurizing device for depressurizing an NMR probe, a gas supply device for supplying gas into the NMR probe to thereby pressurize the NMR probe, and a control device. The control device alternately repeats depressurization of the NMR probe, using the depressurizing device, and pressurization of the NMR probe, using the gas supply device. This replaces the gas in the NMR probe.

6 Claims, 10 Drawing Sheets

(56) References Cited

U.S. PATENT DOCUMENTS

| | | | |
|---|---|---|---|
| 2016/0223628 A1* | 8/2016 | Fujiwara | G01R 33/282 |
| 2017/0322270 A1* | 11/2017 | Wikus | G01R 33/28 |
| 2020/0072917 A1* | 3/2020 | Fujiwara | G01R 33/305 |
| 2021/0199737 A1* | 7/2021 | Hu | B01L 9/00 |
| 2021/0278487 A1* | 9/2021 | Endo | G01R 33/307 |
| 2022/0163608 A1* | 5/2022 | Ardenkjær-Larsen | G01R 33/30 |

FOREIGN PATENT DOCUMENTS

| | | |
|---|---|---|
| JP | 201599037 A | 5/2015 |
| JP | 6323898 B2 | 5/2018 |
| JP | 6471518 B2 | 2/2019 |
| JP | 202034469 A | 3/2020 |
| JP | 6823304 B2 | 2/2021 |

OTHER PUBLICATIONS

Extended European Search Report issued in EP22188819.1 dated Dec. 15, 2022.
Concistre et al., Magic-Angle Spinning NMR of Cold Samples, Accounts of Chemical Research, vol. 46, No. 9, Sep. 17, 2013, pp. 1914-1922.
Ajoy et al., Wide dynamic range magnetic field cycler: Harnessing quantum control at low and high fields, Review of Scienctific Instruments, American Institute of Physics, vol. 90, No. 1, Jan. 31, 2019, pp. 013112-1-013112-12.
Office Action issued in JP2021131777 dated Aug. 29, 2023.

* cited by examiner

NMR APPARATUS AND GAS REPLACEMENT METHOD FOR REPLACING GAS IN NMR PROBE

CROSS REFERENCE TO RELATED APPLICATION

This application claims priority to Japanese Patent Application No. 2021-131777 filed Aug. 12, 2021, the disclosure of which is hereby incorporated by reference in its entirety.

BACKGROUND OF THE DISCLOSURE

Field of the Disclosure

The present disclosure relates to an NMR apparatus for use in a measurement of nuclear magnetic resonance (NMR), in particular, a technique for replacing gas in a device such as an NMR probe or the like.

Description of Related Art

A nuclear magnetic resonance (NMR) apparatus is an apparatus for detecting a signal from an atomic nucleus having a spin magnetic moment by applying a static magnetic field to an atomic nucleus having a spin magnetic moment to thereby cause Larmor precession of the spin magnetic moment, and then radiating to the atomic nucleus a harmonic wave with a high frequency identical with that of the precession so that the atomic nucleus resonates.

In an NMR measurement, an NMR probe holding therein a sample tube holding a sample therein is held in a measurement slot of a static magnetic field generation device, such as a superconducting magnet or the like. In an NMR measurement with respect to a solid sample, a Magic Angle Spinning (MAS) method is generally employed. According to the MAS method, a sample tube with a solid sample held therein is rotated at a high speed while being inclined at a magic angle (substantially 54.7°) relative to the static magnetic field direction, to detect an NMR signal, with the sample tube kept in that condition. Then a cold gas, for example, is supplied to the sample tube in the NMR probe, so that the sample tube is cooled while being rotated at a high speed.

Any of dry air, nitrogen gas, helium gas, and the like is used as the above-described gas, depending on a target temperature. In a case wherein the gas used is of high cost, such as helium gas, pipes for the gas may be arranged to constitute a closed circuit so that the gas circulates in a closed circuit.

JP6471518 discloses a device that circulates a cold helium gas in a closed circuit to thereby rotate a sample tube in an NMR probe.

In the device disclosed in the above-noted JP6471518, the closed circuit must be opened when replacing an NMR probe or a sample tube. Even a system that can replace a sample without opening the closed circuit cannot completely avoid introduction of air into a part of the device, and even momentary opening of such a closed circuit cannot avoid introduction of air into the NMR apparatus or the NMR probe. In an NMR apparatus used at low temperature, gas or liquid contained in air may be liquified or solidified, and thus clog a pipe constituting the closed circuit. In particular, when a small slot formed on a module for rotating the sample tube is clogged, unstable rotation of the sample tube will result.

Figure 12:
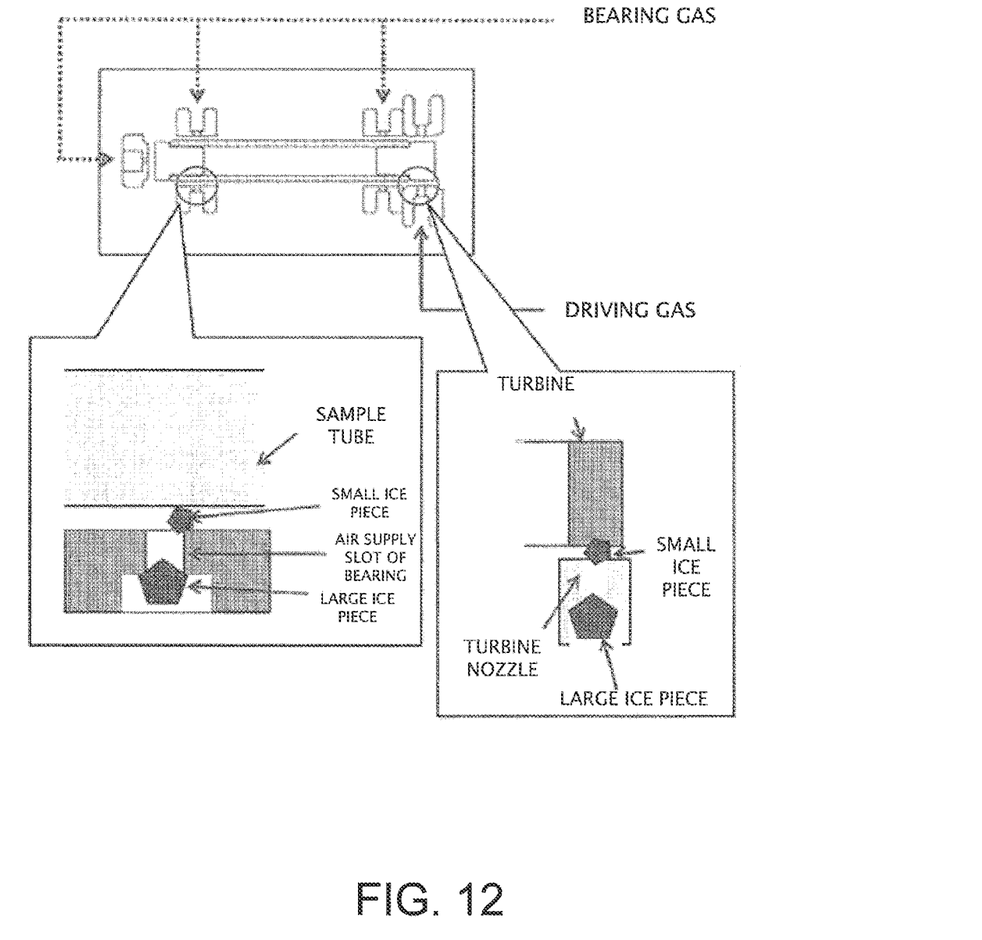
FIG. 12 illustrates the structure of a sample tube and an area around the sample tube.

This point will be described in detail, by reference to FIG. 12. FIG. 12 illustrates the structure of a sample tube and an area around the sample tube. A sample tube is supplied with a driving gas for rotating the sample tube and a bearing gas for bearing the sample tube.

For example, if gas or liquid contained in the air is solidified as described above, large pieces of ice can clog the air supply slot for supplying a bearing gas; small pieces of ice can be caught between the bearing and the sample tube; or smaller pieces of ice can be discharged from the air supply slot to impact the sample tube, before being discharged to outside the bearing. In the case where pieces of ice are caught between the bearing and the sample tube, for example, the sample tube may stop rotating. In a case wherein ice pieces small enough to pass through the air supply slot are generated or ice pieces are adhered to the sample tube, the sample tube may rotate unstably or stop rotating. In a case wherein pieces of ice large enough to be caught in the air supply slot are generated, the sample tube may be held less stably, or may not be held at all, so that the sample tube may contact the bearing.

In a case wherein small pieces of ice pass through the turbine nozzle to impact the sample tube, the sample tube may be made unstable. In a case wherein ice pieces large enough to clog the turbine nozzle are generated, the turbine cannot rotate, even if gas is applied or pressurized into the turbine, which can impede increasing the rotational speed of the sample tube.

In order to prevent generation of condensation when opening a closed circuit or introduction of gas into a pipe, the temperature inside the NMR apparatus or the NMR probe can be maintained at normal temperature. With this method, however, a longer period of time is required to raise the temperature to normal temperature when the temperature of the apparatus is lower.

SUMMARY OF THE DISCLOSURE

In view of the above, an object of the present disclosure is to prevent possible clogging in a rotation mechanism for rotating a sample tube when replacing a probe or sample tube in an NMR apparatus used at low temperature.

According to one aspect of the present disclosure, there is provided an NMR apparatus including an NMR probe for holding a sample therein; a depressurizing device for depressurizing the NMR probe or an accessory device for replacing the sample; a gas supply device for supplying gas into the NMR probe to thereby pressurize the NMR probe; and a control device for controlling depressurization using the depressurizing device and pressurization using the gas supply device, wherein the control device alternately repeats depressurization of the NMR probe, using the depressurizing device, and pressurization of the NMR probe, using the gas supply device.

The above-described structure alternately repeats depressurization using the depressurizing device and pressurization using the gas supply device to replace the gas in the NMR probe. That is, for example, although some air is introduced into the NMR probe when the NMR probe is taken out from the NMR apparatus to replace the sample and the NMR probe with a replaced sample therein is set back in the NMR apparatus, the above-described structure can discharge the air from the NMR probe through alternate application of depressurization and pressurization, so that the air in the NMR probe is replaced by the gas supplied by the gas supply device. Such gas replacement can prevent solidification and liquidation of air in the NMR probe even when an NMR measurement is conducted under low temperature.

In one embodiment, the control device may alternately repeat depressurization and pressurization within the range of pressure resistance of the NMR probe.

In another embodiment, the control device may alternately repeat depressurization and pressurization until the percentage of the amount of air remaining in the NMR probe becomes equal to a target value.

In another embodiment, provided that the air pressure is P0, the pressure in the NMR probe in depressurization is P1, the pressure in the NMR probe in pressurization is P2, and the number of times the depressurization and the pressurization are repeated is N, the target value may be defined as $\{(P1/P0)(P0/P2)\}^N \times 100\%$.

In another embodiment, the NMR apparatus according to the present disclosure may further include a first buffer tank disposed between the depressurizing device and the NMR probe; and a second buffer tank disposed between the gas supply device and the NMR probe, wherein, for the depressurization, the control device may depressurize the first buffer tank and further depressurize the NMR probe, utilizing depressurization of the first buffer tank, and, for pressurization, the control device may pressurize the second buffer tank and further pressurize the NMR probe, utilizing pressurization of the second buffer tank.

In another embodiment, the gas to be supplied by the gas supply device may be gas of the same type as the type of gas to be supplied into the NMR probe during NMR measurement.

According to another aspect of the present disclosure, there is provided a gas replacement method for replacing the gas in an NMR probe, including the steps of depressurizing the NMR probe that holds a sample therein and is set in an NMR apparatus; supplying gas into the NMR probe after the depressurization to thereby pressurize the NMR probe; and alternately repeating depressurization and pressurization to thereby replace the gas in the NMR probe.

According to the present disclosure, it is possible to prevent possible clogging in a rotation mechanism for rotating a sample tube due to replacement of a probe or a sample tube in an NMR apparatus used at low temperature.

BRIEF DESCRIPTION OF THE DRAWINGS

Embodiments of the present disclosure will be described based on the following figures, wherein.

DESCRIPTION OF THE DISCLOSURE

First Embodiment

Figure 1:
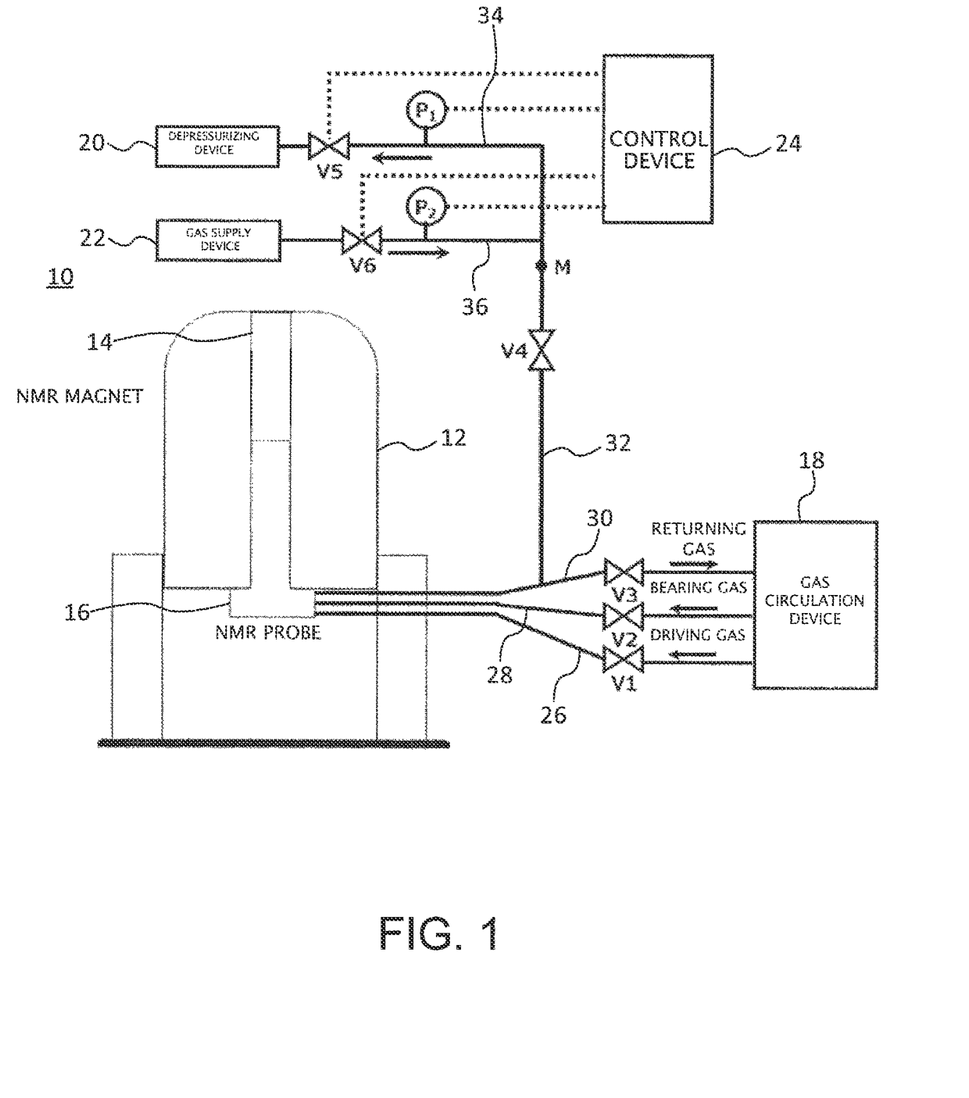
FIG. 1 illustrates an NMR apparatus according to a first embodiment.

Referring to FIG. 1, a nuclear magnetic resonance (NMR) apparatus according to a first embodiment will now be described. FIG. 1 illustrates one example of an NMR apparatus according to the first embodiment. The NMR apparatus 10 according to the first embodiment is an apparatus for measuring an NMR signal generated by an observation atomic nucleus contained in a sample.

A static magnetic field generation device 12 is a device for generating a static magnetic field, and has a bore 14, or a vertically extending hollow portion, formed at its middle portion. An NMR probe 16 has a cylindrical shape extending vertically as a whole, and is to be inserted into the bore 14 of the static magnetic field generation device 12.

The NMR probe 16 is used to implement a Magnetic Angle Spinning (MAS) method, for example. Specifically, the NMR probe 16 has a transmission and reception detection coil, and is able to hold a sample tube in an inclined state at a magic angle, the sample tube being able to hold a sample therein. The sample tube may have a cylindrical shape, for example, to facilitate holding a solid sample therein. Naturally, liquid sample is usable. In the NMR probe 16, a sample tube is supported on its circumference with a precision gas bearing along the rotational axis, which is inclined at a magic angle relative to the static magnetic field, and rotates at a high speed in a measurement. Any gas, such as dry air, nitrogen gas, helium gas, or the like is supplied into the sample tube in the NMR probe, depending on a target temperature, and the sample tube is caused to rotate at a high speed with the gas. Further, because a low temperature gas (for example, nitrogen gas or helium gas cooled to a target temperature) is supplied into the sample tube, the sample in the sample tube is cooled by the low temperature gas.

The NMR apparatus 10 includes a gas circulation device 18, a depressurizing device 20, a gas supply device 22, and a control device 24.

The gas circulation device 18 is a device for supplying gas into the NMR probe 16 and collecting the gas from the NMR probe 16, while circulating the gas in a closed circuit. The gas may be, for example, dry air, nitrogen gas, helium gas, or the like.

Specifically, the closed circuit is composed of a driving pipe 26, a bearing pipe 28, and a return pipe 30.

The driving pipe 26 is a pipe extending from the gas circulation device 18 to the inside of the NMR probe 16, for supplying into the NMR probe 16 gas (that is, a driving gas) for rotating a sample tube held in the NMR probe 16.

The bearing pipe 28 is a pipe extending from the gas circulation device 18 to the inside of the NMR probe 16, for supplying into the NMR probe 16 gas (that is, a bearing gas) for supporting a sample tube held in the NMR probe 16. It should be noted that a bearing gas is gas for use as a gas bearing of a sample tube.

The return pipe 30 is a pipe extending from the gas circulation device 18 to the inside of the NMR probe 16, for use to return the gas having been supplied into the NMR probe 16 back to the gas circulation device 18.

The gas circulation device 18 supplies a driving gas through the driving pipe 26 to a sample tube held in the NMR probe 16 to thereby rotate the sample tube. Further, the gas circulation device 18 supplies a bearing gas through the bearing pipe 28 to a sample tube held in the NMR probe 16. The bearing gas supports the sample tube.

The driving gas and the bearing gas are collected through the return pipe 30 by the gas circulation device 18. The collected gas is supplied through the driving pipe 26 and the bearing pipe to the sample tube in the NMR probe 16, and then collected again through the return pipe 30 by the gas circulation device 18. That is, the gas is circulated by the gas circulation device 18, and the sample tube is supported and rotated with the gas. Further, gas having been cooled to a target temperature is supplied to the sample tube, so that the sample in the sample tube is cooled by the low temperature gas. The gas may be, for example, helium gas or nitrogen gas at an extremely low temperature.

The driving pipe 26 has a valve V1 installed therein; the bearing pipe 28 has a valve V2 installed therein; and the return pipe 30 has a valve V3 installed therein. Controlling opening and closing of the valve V1 controls supply of a driving gas into the NMR probe 16. Controlling opening and closing of the valve V2 controls supply of a bearing gas into the NMR probe 16. Controlling opening and closing of the valve V3 controls collection of the gas by the gas circulation device 18.

A pipe 32 is connected, via one end, to the middle of the return pipe 30. The pipe 32 has a valve V4 installed therein.

The other end of the pipe 32 is connected to one end of a depressurizing pipe 34 and one end of a pressurizing pipe 36. The other end of the depressurizing pipe 34 is connected to the depressurizing device 20, and the other end of the pressurizing pipe 36 is connected to the gas supply device 22.

The depressurizing pipe 34 has a valve V5 installed therein, and is connected to a pressure gauge P1. The pressurizing pipe 36 has a valve V6 installed therein, and is connected to a pressure gauge P2.

The pressure gauge P1 measures the pressure in the depressurizing pipe 34. The pressure gauge P2 measures the pressure in the pressurizing pipe 36.

The respective pressure gauges P1, P2 are connected to the control device 24, and output the respective results of measurements by the pressure gauges P1, P2 to the control device 24.

The control device 24 is connected to the valves V5, V6 to control opening and closing of the respective valves V5, V6. Note that the valves V1, V2, V3 may be connected to the control device 24, so that the control device 24 controls opening and closing of the respective valves V1, V2, V3.

The depressurizing device 20 is, for example, a pump, and depressurizes the depressurizing pipe 34, the pipe 32, and the return pipe 30, and further depressurizes the NMR probe 16 through these pipes.

The gas supply device 22 supplies gas into the pressurizing pipe 36, the pipe 32, and the return pipe 30, and further into the NMR probe 16 through these pipes. When gas is supplied, the gas supply device 22 pressurizes the pressurizing pipe 36, the pipe 32, the return pipe 30, and the NMR probe 16. Note that the gas to be supplied from the gas supply device 22 is gas of the same type as the gas to be supplied into the NMR probe 16 in an NMR measurement. That is, gas of the same type as the gas to be circulated by the gas circulation device 18 is supplied from the gas supply device 22. For example, dry air, nitrogen gas, helium gas, or the like is used. Further, gas at temperature in accordance with a target temperature is used. For example, helium gas or nitrogen gas cooled to an extremely low temperature is used.

The control device 24 controls opening and closing of the respective valves V5, V6. The control device 24 may control the operations of the depressurizing device 20 and the gas supply device 22. The control device 24 may control opening and closing of the respective valves V1, V2, V3, V4.

The control device 24 is a computer, for example, and includes a processor, such as a Central Processing Unit (CPU) or the like, and a memory device, such as a memory or a hard disk drive. For example, a program is stored in the memory device, and the processor executes the program to thereby implement the function of the control device 24. Specifically, opening and closing of the respective valves V5, V6, and the operations of the depressurizing device 20 and the gas supply device 22 are controlled. The function of the control device 24 may be implemented using hardware, such as an electronic circuit, or a programmable circuit.

In NMR measurement, the valves V1, V2, V3 are opened, and the valve V4 is closed. A driving gas is supplied from the gas circulation device 18 through the driving pipe 26 into the NMR probe 16 to cause a sample tube held in the NMR probe 16 to rotate. Also, a bearing gas is supplied from the gas circulation device 18 through the bearing pipe 28 into the NMR probe 16 to support the sample tube held in the NMR probe 16. The driving gas and the bearing gas are collected by the gas circulation device 18 through the return pipe 30. The driving gas and the bearing gas cool the sample in the sample tube to a target temperature (for example, extremely low temperature), and the cooled sample is then subjected to an NMR measurement.

Figure 2:
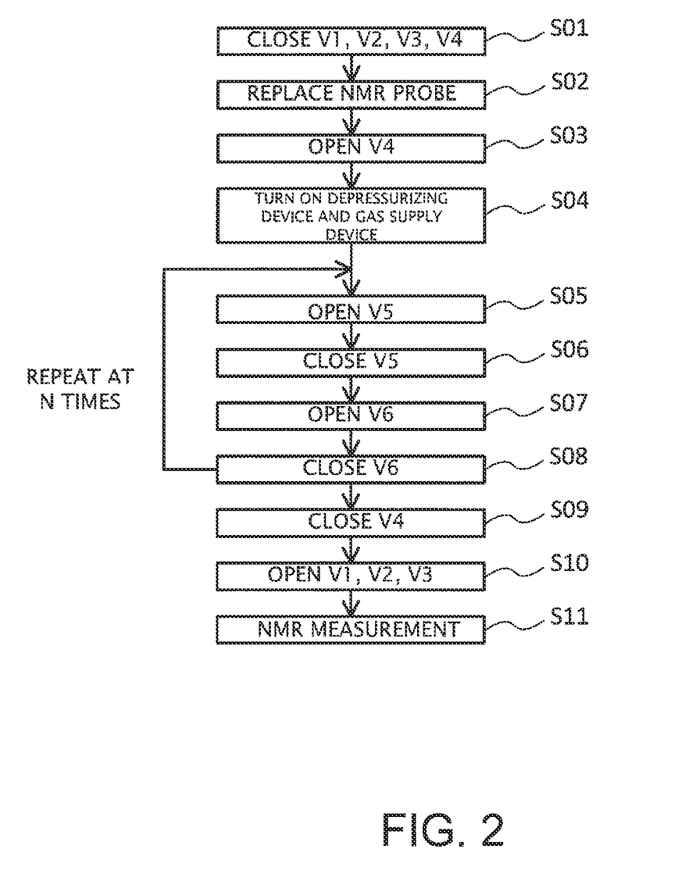
FIG. 2 is a flowchart of the operation of the NMR apparatus according to the first embodiment.

Referring to FIG. 2, the operation of the NMR apparatus 10 in replacing the NMR probe 16 will be described. FIG. 2 is a flowchart of the operation for replacement.

In replacement of the NMR probe 16, the valves V1, V2, V3, V4 are closed either manually by an operator or automatically by the control device 24 (S01).

Then, the NMR probe 16 held in the bore 14 of the static magnetic field generation device 12 is replaced (S02). Specifically, for example, the NMR probe 16 is taken out from the bore 14 of the static magnetic field generation device 12, and the sample tube in the NMR probe 16 is replaced. Thereafter, the NMR probe 16 with a replaced sample tube is inserted back into the bore 14 of the static magnetic field generation device 12. Alternatively, the NMR probe 16 itself may be replaced.

As some air is introduced into the replaced NMR probe 16, gas replacement as described below is executed to expel the air.

Specifically, the valve V4 is opened either manually by an operator or automatically by the control device 24, with the valves V1, V2, V3 kept closed (S03).

The depressurizing device 20 and the gas supply device 22 are turned on (S04). For example, the control device 24 turns on the depressurizing device 20 and the gas supply device 22 in response to an instruction from an operator.

Thereafter, the control device 24 opens the valve V5 with the valve V6 kept closed (S05). With the above, the NMR probe 16 is depressurized by the depressurizing device 20. The depressurization is continued until the pressure P1 measured on the pressure gauge P1 becomes equal to a target pressure Pa. The target pressure Pa is set in advance by an operator or the like.

When the pressure P1 measured on the pressure gauge P1 becomes equal to the target pressure Pa, the control device 24 closes the valve V5 (S06).

Thereafter, the control device 24 opens the valve V6 with the valve V5 kept closed (S07). With the above, gas is supplied from the gas supply device 22 into the NMR probe 16 for pressurization. The pressurization is continued until the pressure P2 measured on the pressure gauge P2 becomes equal to the target pressure Pb. The target pressure Pb is set in advance by an operator or the like.

When the pressure P2 measured on the pressure gauge P2 becomes equal to the target pressure Pb, the control device 24 closes the valve V6 (S08).

The control device 24 repeats this operation in steps S05 to S08 N times. That is, the control device 24 alternately applies depressurization using the depressurizing device 20 and pressurization using the gas supply device 22 N times, as described above. Note that N may be set by an operator or the like, may be set in advance, or may be calculated and set based on the target pressure inside the NMR probe 16.

After N-time repetition of the operation in steps S05 to S08, the control device 24 closes the valve V4 (S09).

Then, the control device 24 opens the valves V1, V2, V3 (S10).

Thereafter, the NMR apparatus 10 executes an NMR measurement (S11).

In the manner described above, the gas in the replaced NMR probe 16 is replaced. In other words, although some air (for example, nitrogen gas or oxygen gas) exists in the NMR probe 16 immediately after replacement of the sample, the air in the NMR probe 16 is discharged to outside the NMR probe 16 through alternate application of depressurization using the depressurizing device 20 and pressurization using the gas supply device 22, so that the NMR probe 16 is filled with the gas for use in an NMR measurement. In this manner, the gas inside the NMR probe 16 is replaced.

The pressures P1, P2 will next be described. Depressurization and pressurization are controlled such that the pressure P1 satisfies Expression (1) below and that the pressure P2 satisfies Expression (2) below.

$$X < P1 < P0 \tag{1}$$

$$P0 < P2 < Y \tag{2}$$

The pressure P0 is the air pressure. Pressures X, Y are determined based on at least one of the pressure resistance of the NMR probe 16, that of the sample tube, and the condition of the sample. The pressures X, Y will next be described in detail.

The pressure X is a value relevant to boiling or leakage of a sample or the like. To measure a liquid sample, the pressure X is determined based on a design value or an experimental value that enables close sealing of a sample in a sample tube. For example, provided that the sample tube is capable of close sealing of a sample in a sample tube under a pressure 1 Pa at maximum, the pressure 1 Pa is used as the pressure X. To measure a solid sample that will not collapse even after moisture contained in the solid sample is drained from the solid sample, the depressurizing performance data of a vacuum pump or the vacuum pressure resistance value of a pipe is used as the pressure X.

The pressure Y is a value determined based on a design pressure resistance required for the NMR probe 16. Specifically, a design value of a structurally weakest part of the NMR probe 16 is used as the pressure Y. For example, if the structural components of the NMR probe 16 are resistive up to a pressure of 500 kPa, pressures (for example, 250 kPa) lower than 500 kPa are used as the pressure Y.

If a sample tube should rotate upon receipt of pressure, the sample tube may touch the bearing, which may cause frictional scratches on both the sample tube and the bearing. When frictional scratching occurs, the sample tube may be damaged while rotating, depending on the extent of the frictional scratching. Moreover, the strength of the bearing for supporting the sample tube may decrease, which may lead to unstable rotation of the sample tube. In view of the above, the amount of pressure to be applied to the sample tube is such an amount that does not cause the sample tube to rotate when the pressure is applied to the sample tube.

It should be noted that both depressurization using the depressurizing device 20 and pressurization using the gas supply device 22 may be applied, or only one of depressurization or pressurization may be applied.

Figure 3:
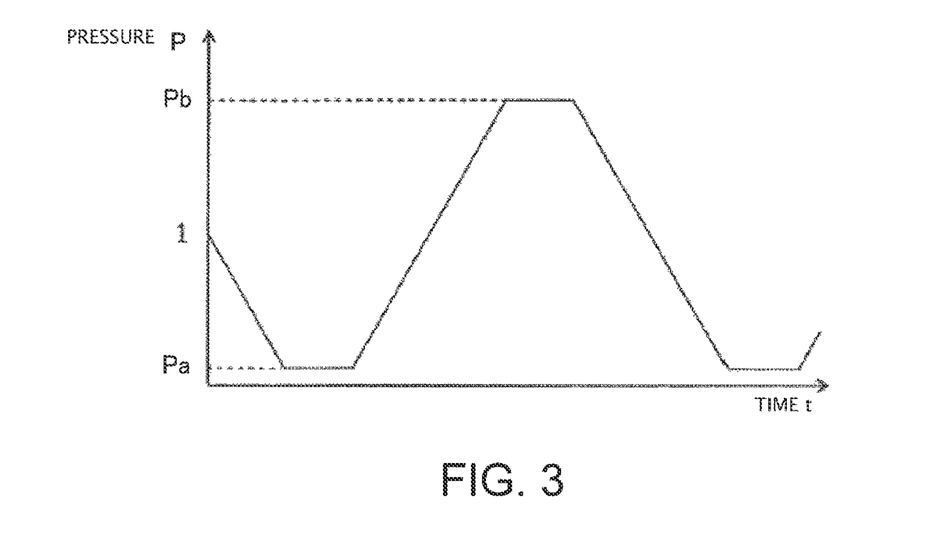
FIG. 3 illustrates change in pressure with elapse of time.

FIG. 3 is a graph showing change in pressure over time, wherein the x-axis represents time t, and the y-axis represents a pressure P measured on the pressure gauge P1 or P2. Specifically, the pressure P in depressurization is a pressure measured on the pressure gauge P1, while the pressure P in pressurization is a pressure measured on the pressure gauge P2. That is, the pressure P corresponds to an estimated value of the pressure in the NMR probe 16. In other words, the pressure in the NMR probe 16 is estimated on the pressure gauges P1, P2.

In the example illustrated in FIG. 3, depressurization and pressurization are repetitively applied with a reference pressure (for example, the air pressure) in between. For example, depressurization is continued until the pressure P becomes equal to the target pressure Pa, and pressurization is continued until the pressure P becomes equal to the target pressure Pb. The respective target pressures Pa, Pb may be maintained for a predetermined period of time. The period of time, or a duration, during which the target pressure Pa is maintained may or may not be of the same length as that of the target pressure Pb. The duration may or may not be of the same length for every application of depressurization or pressurization. For example, the control device 24 may prolong or shorten the duration of the target pressure Pa or Pb as the number of times of repetitive application of depressurization and pressurization increases. The control device 24 may keep the duration as long as a predetermined length for every application. Instead, the target pressures Pa, Pb may be maintained not for a predetermined duration, but pressurization may be applied once the pressure P reaches the target pressure Pa and depressurization may be applied once the pressure P reaches the target pressure Pb.

The speed of depressurization and that of pressurization (that is, the slope of the graph) may or may not be the same for every application of depressurization and pressurization. That is, the control device 24 may change the speed of depressurization for every depressurization, and the speed of pressurization for every pressurization.

Depressurization and pressurization may be repetitively applied within a range of pressure equal to or lower than a reference pressure (for example, the air pressure) or a range in excess of a reference pressure.

Through the above-described repetitive depressurization and pressurization, the gas in the NMR probe 16 is replaced. For example, depressurization and pressurization are repeated until the percentage of the amount of air remaining in the NMR probe 16 becomes equal to a target value. The remaining air is, for example, nitrogen gas and oxygen gas.

The percentage of the amount of air (for example, nitrogen gas and oxygen gas) remaining in the NMR probe 16 after replacement of the gas is expressed with Expression (3) below.

$$\{(P1/P0)(P0/P2)\}^N \times 100\% \tag{3}$$

wherein N is the number of times the operation in step S05 to S08 in FIG. 2 is repeated.

Figure 4:
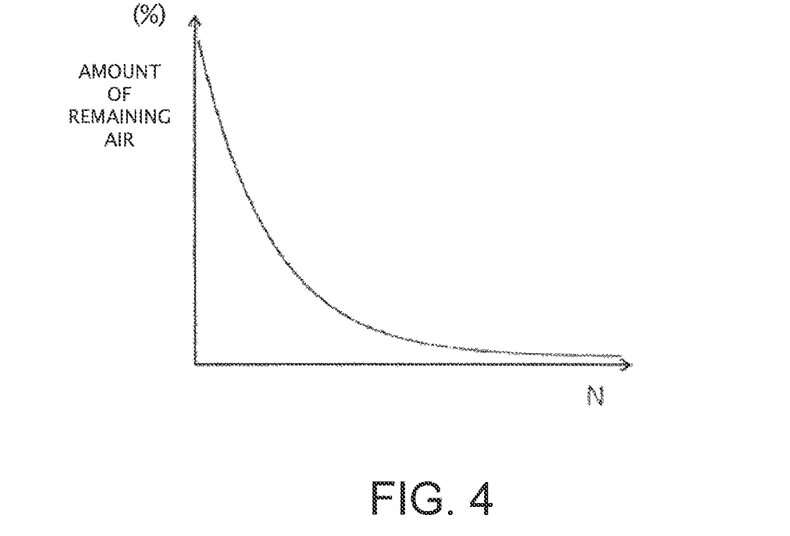
FIG. 4 indicates the percentage of the amount of air remaining.

FIG. 4 is a graph showing the relationship between the number of times N and the percentage of the amount of remaining air, wherein the x-axis represents the number of times N, and the y-axis represents the percentage (%) of the amount of remaining air. A larger number of times N leads to a smaller percentage of the amount of remaining air.

For example, depressurization and pressurization are repetitively applied until a value obtained with Expression (3) becomes equal to or less than 1%, 0.1%, or 0.01%. Note that these values are mere examples, and the value is set in accordance with the purpose.

A gas chromatograph or an oxygen densitometer is connected to point M in FIG. 1 to measure the percentage of the actual amount of air (for example, nitrogen gas or oxygen gas), so that depressurization and pressurization may be repetitively applied until the measured result becomes equal to a target value.

In a configuration wherein a user determines a target value of the percentage of the amount of remaining air, the target value may be substituted into Expression (3) as the percentage of the amount of remaining air to calculate the number of times N required for the measured result to become equal to the target value. In this case, the calculated number of times N is set as the number of times the operation in steps S05 to S08 is repeated. The control device 24 repetitively executes the operation in step S05 to S08 N times, or the calculated number of times.

In the first embodiment, the pipe 32 for use in depressurization and pressurization is connected to the return pipe 30, or a pipe that does not contribute to either rotation or bearing of the sample tube. This enables application of depressurization and pressurization, while avoiding influence of depressurization and pressurization on the rotation and bearing of the sample tube.

Second Embodiment

Figure 5:
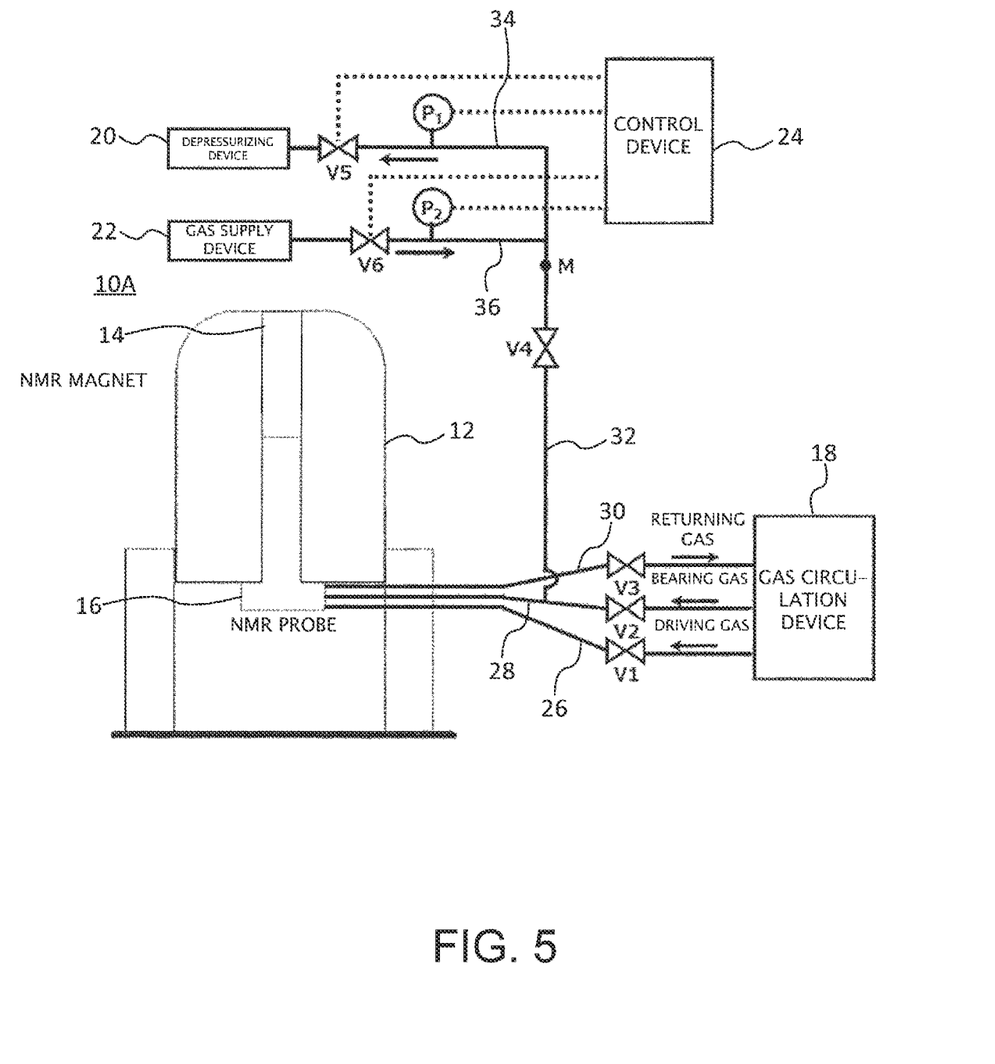
FIG. 5 illustrates an NMR apparatus according to a second embodiment.

Referring to FIG. 5, an NMR apparatus according to a second embodiment will now be described. FIG. 5 illustrates an NMR apparatus 10A according to the second embodiment. The NMR apparatus 10A according to the second embodiment differs from the NMR apparatus 10 according to the first embodiment only in that one end of the pipe 32 for use in depressurizing and pressurization is connected to the middle of the bearing pipe 28. The remaining structure of the NMR apparatus 10A is the same as the corresponding structure of the NMR apparatus 10. Further, the operations for depressurization and pressurization are the same as those in the first embodiment. The NMR apparatus 10A according to the second embodiment as well can achieve the same advantage as that which the NMR apparatus 10 according to the first embodiment can achieve.

Third Embodiment

Figure 6:
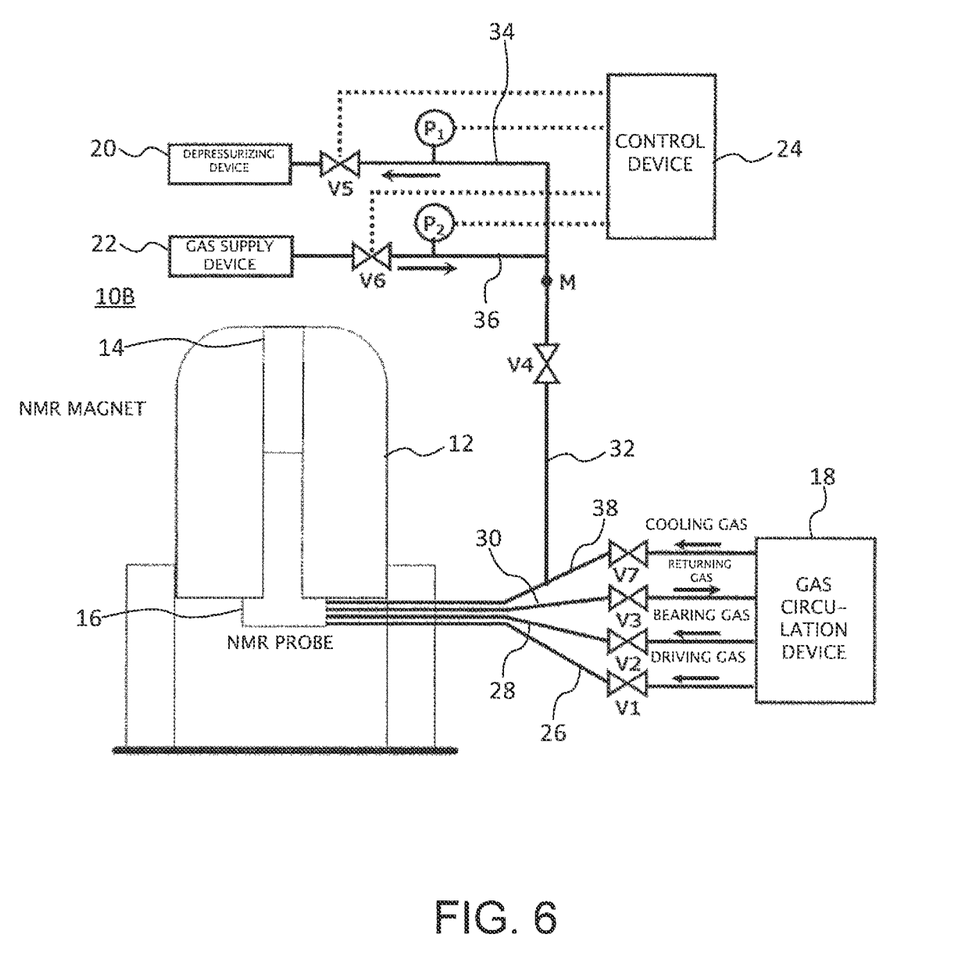
FIG. 6 illustrates an NMR apparatus according to a third embodiment.

Referring to FIG. 6, an NMR apparatus according to a third embodiment will now be described. FIG. 6 illustrates an NMR apparatus 10B according to the third embodiment. The NMR apparatus 10B according to the third embodiment uses a cooling pipe 38. The cooling pipe 38 is a pipe extending from the gas circulation device 18 to the inside of the NMR probe 16, for use in supplying a cooling gas into the NMR probe 16 to cool the sample tube. The cooling pipe 38 has a valve V7 installed therein. Controlling opening and closing of the valve V7 controls supply of a cooling gas into the NMR probe 16. The remaining structure of the NMR apparatus 10B other than the cooling pipe 38 and the valve V7 is the same as the corresponding structure of the NMR apparatus 10 according to the first embodiment.

The operations for depressurization and pressurization are basically the same as those of the NMR apparatus 10 according to the first embodiment. The valve V7 is opened and closed at the same timing as the valves V1, V2, V3. That is, when the valves V1, V2, V3 are opened, the valve V7 is opened, and when the valves V1, V2, V3 are closed, the valve V7 is closed.

The NMR apparatus 10B according to the third embodiment as well can achieve the same advantage as that which the NMR apparatus 10 according to the first embodiment can achieve.

Fourth Embodiment

Figure 7:
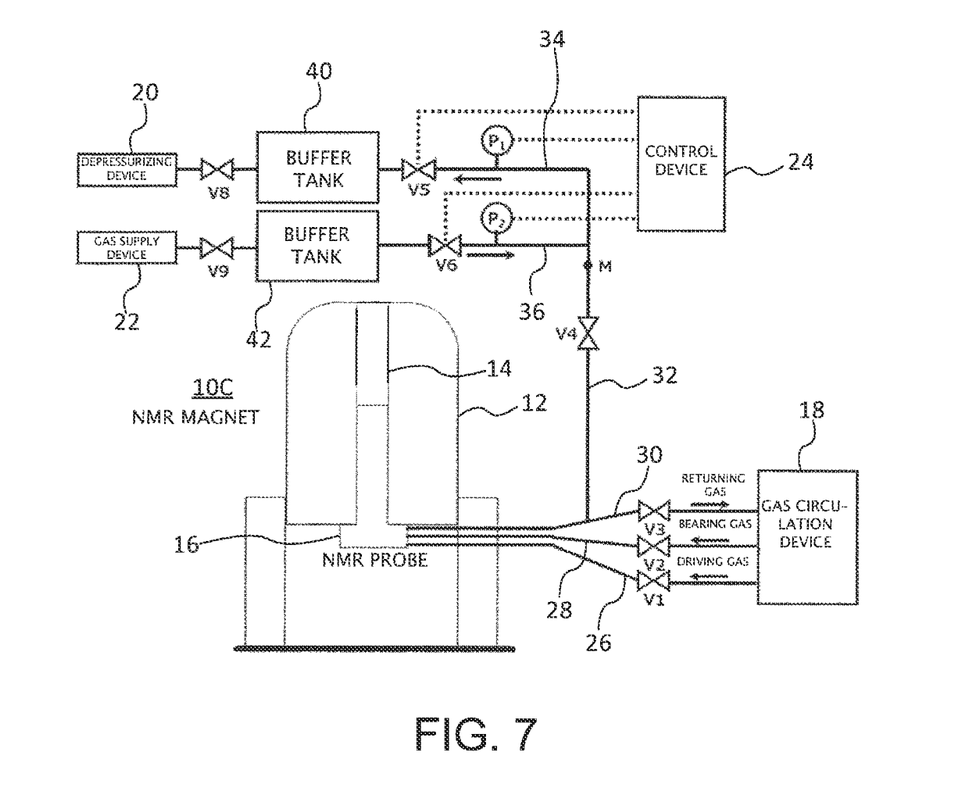
FIG. 7 illustrates an NMR apparatus according to a fourth embodiment.

Referring to FIG. 7, an NMR apparatus according to a fourth embodiment will now be described. FIG. 7 illustrates an NMR apparatus 10C according to the fourth embodiment. The NMR apparatus 10C according to the fourth embodiment uses buffer tanks 40, 42.

The buffer tank 40 is provided to the depressurizing pipe 34. The buffer tank 42 is provided to the pressurizing pipe 36. The capacities of the buffer tanks 40, 42 may or may not be the same.

The buffer tank 40 is connected to the depressurizing device 20 via a pipe that has a valve V8 installed therein. The buffer tank 42 is connected to the gas supply device 22 via a pipe that has a valve V9 installed therein. Opening and closing of the valves V8, V9 may be controlled by the control device 24 or an operator.

The remaining structure of the NMR apparatus 10C other than the buffer tanks 40, 42 and the valves V8, V9 is the same as that of the NMR apparatus 10 according to the first embodiment. Note that the buffer tank 40 corresponds to one example of a first buffer tank, and the buffer tank 42 corresponds to one example of a second buffer tank.

In the fourth embodiment, for pressurization, the control device 24 pressurizes the buffer tank 42, and further pressurizes the NMR probe 16, utilizing the pressurization of the buffer tank 42. For depressurization, the control device 24 depressurizes the buffer tank 40, and further depressurizes the NMR probe 16, utilizing the depressurization of the buffer tank 40. That is, for pressurization, the buffer tank 42 is first pressurized, and the NMR probe 16 is thereafter pressurized, utilizing the pressurization of the buffer tank 42. For depressurization, the buffer tank 40 is first depressurized, and the NMR probe 16 is thereafter depressurized, utilizing the depressurization of the buffer tank 40.

The operation of the NMR apparatus 10C will next be described in detail.

Similar to the NMR apparatus 10 according to the first embodiment, the valves V1, V2, V3 are opened and the valve V4 is closed in an NMR measurement. A driving gas is supplied from the gas circulation device 18 through the driving pipe 26 into the NMR probe 16, so that the sample tube held in the NMR probe 16 is caused to rotate. Further, the bearing gas is supplied from the gas circulation device 18 through the bearing pipe 28 into the NMR probe 16 to support the sample tube held in the NMR probe 16. The driving gas and the bearing gas are collected through the returning pipe 30 by the gas circulation device 18. The driving gas and the bearing gas cool the sample in the sample tube to a target temperature (for example, an extremely low temperature), and the cooled sample is subjected to NMR measurement.

When replacing the NMR probe 16, the valves V1, V2, V3, V4 are closed before the NMR probe 16 in the bore 14 of the static magnetic field generation device 12 is replaced. As some air is introduced into the replaced NMR probe 16, gas replacement is executed as described below to expel the air.

Specifically, the valve V4 is opened, with the valves V1, V2, V3 kept closed. The depressurizing device 20 and the gas supply device 22 are then turned on.

Thereafter, the valve V8 is opened, with the valve V5 kept closed, so that the buffer tank 40 is depressurized by the depressurizing device 20. Further, the valve V9 is opened with the valve V6 kept closed, so that the buffer tank 42 is pressurized by the gas supply device 22. Note that the valves V8, V9 may be opened with the control device 24 or by an operator.

Thereafter, the control device 24 opens the valve V5 while the valve V6 is kept closed, so that the NMR probe 16 is depressurized utilizing the depressurization of the buffer tank 40, and thereafter further depressurized by the depressurizing device 20. The depressurization is continued until the pressure P1 measured on the pressure gauge P1 becomes equal to a target pressure Pa.

When the pressure P1 measured on the pressure gauge P1 becomes equal to the target pressure Pa, the control device 24 closes the valve V5.

Thereafter, the control device 24 opens the valve V6 while the valve V5 is kept closed, so that the NMR probe 16 is pressurized utilizing the pressurization of the buffer tank 42, and thereafter further pressurized by the gas supply device 22. The pressurization is continued until the pressure P2 measured on the pressure gauge P2 becomes equal to a target pressure Pb.

When the pressure P2 measured on the pressure gauge P2 becomes equal to the target pressure Pb, the control device 24 closes the valve V6.

Similar to the operation of the NMR apparatus 10 according to the first embodiment, the control device 24 alternately repeats depressurization and pressurization N times. After alternate repetition of depressurization and pressurization N times, the control device 24 closes the valve V4.

Then, the control device 24 opens the valves V1, V2, V3. Thereafter, the NMR apparatus 10 executes an NMR measurement.

In this manner as described above, the gas in the replaced NMR probe 16 is replaced.

In the fourth embodiment, the buffer tank 40 is depressurized and the buffer tank 42 is pressurized before depressurization/pressurization of the NMR probe 16, whereby the pressure in the NMR probe 16 changes more rapidly, as compared with the first embodiment. That is, it takes a shorter period of time for the pressure in the NMR probe 16 to be depressurized to the target pressure Pa or to be pressurized to the target pressure Pb, as compared with the first embodiment.

Figure 8:
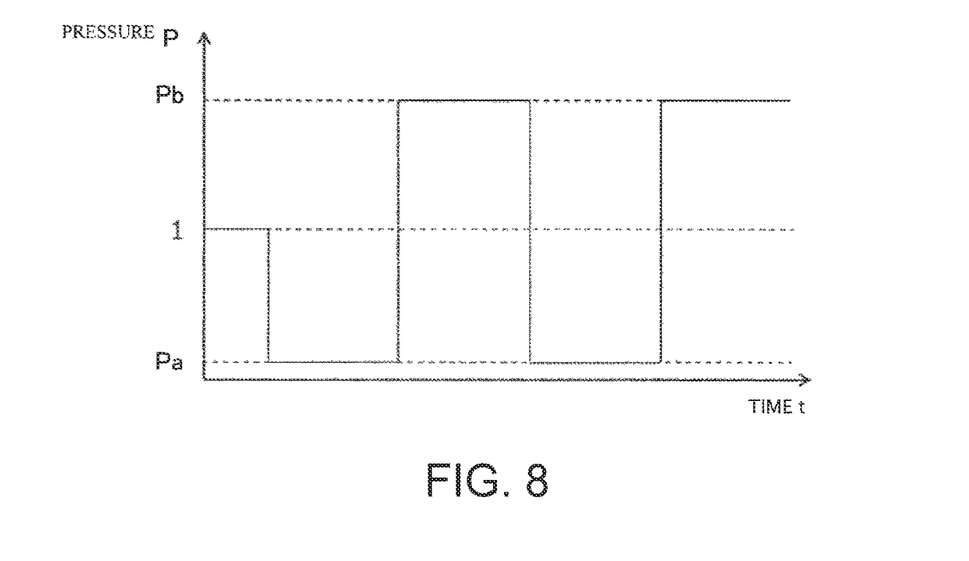
FIG. 8 illustrates change in pressure with elapse of time.

FIG. 8 is a graph showing change in pressure P with elapse of time according to the third embodiment. As the pressure in the NMR probe 16 changes more rapidly, the graph in FIG. 8 shows a shape more like a rectangle, compared with that in FIG. 3 relevant to the first embodiment As described by reference to FIG. 3, the respective durations for maintaining the target pressure Pa, Pb may or may not be identical, or may be changed depending on the number of times of application of depressurization and pressurization.

Fifth Embodiment

Figure 9:
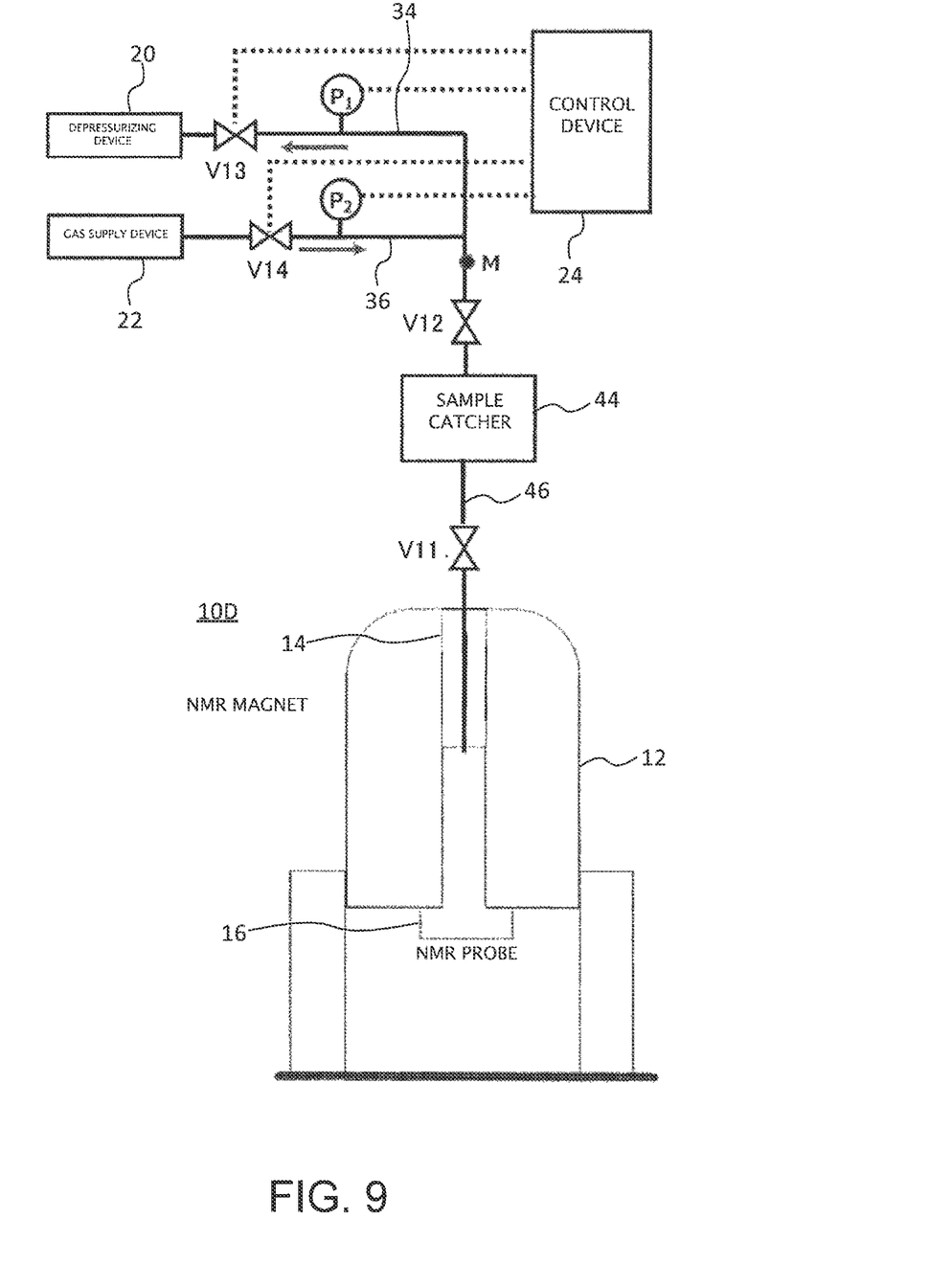
FIG. 9 illustrates an NMR apparatus according to a fifth embodiment.

Referring to FIG. 9, an NMR apparatus according to a fifth embodiment will now be described. FIG. 9 illustrates an NMR apparatus 10D according to the fifth embodiment. The NMR apparatus 10D includes a sample catcher 44. The sample catcher 44 is a mechanism for introducing a sample tube into the NMR probe 16 and collecting the sample tube from the NMR probe 16.

A sample exchanging pipe 46 is connected, via one end, to the NMR probe 16, and has the sample catcher 44 connected to a middle thereof. The other end of the sample exchanging pipe 46 is connected to one end of the depressurizing pipe 34 and one end of the pressurizing pipe 36.

The sample exchanging pipe 46 has valves V11, V12 installed therein. Specifically, the valve V11 is positioned between the NMR probe 16 and the sample catcher 44. The valve V12 is positioned closer to the depressurizing pipe 34 and the pressurizing pipe 36 than is the sample catcher 44. Opening and closing of the valves V11, V12 may be controlled by the control device 24 or performed by an operator.

Similar to the NMR apparatus 10 according to the first embodiment, the NMR apparatus 10D includes the depressurizing device 20, the gas supply device 22, and the control device 24. The depressurizing pipe 34 has a valve V13 installed therein, and is connected to the pressure gauge P1. The pressurizing pipe 36 has a valve V14 installed therein, and is connected to the pressure gauge P2. Opening and closing of the valves V13, V14 is controlled by the control device 24.

Figure 10:
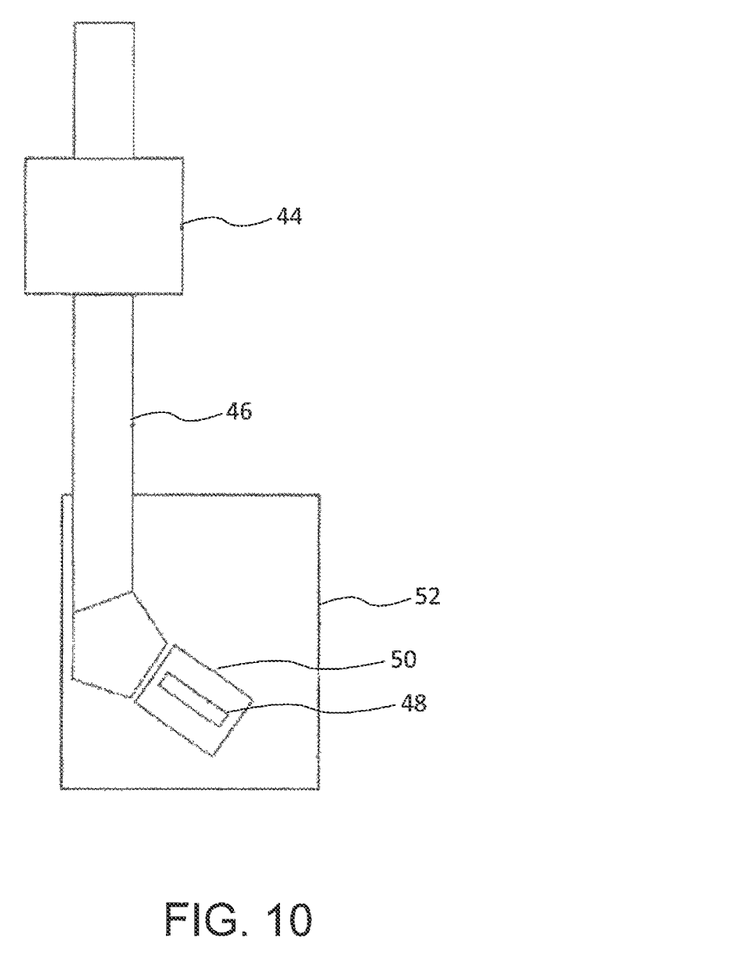
FIG. 10 illustrates a structure of a sample tube and an area around the sample tube.

FIG. 10 illustrates the structure of a sample tube and an area around the sample tube. An MAS module 50 including a detection coil or the like is disposed around a sample tube 48. The sample tube 48 and the MAS module 50 are covered with a probe cover 52 to be housed under the probe cover 52. Note that the valves V11, V12 are not illustrated in FIG. 10.

In an NMR measurement, the valve V11 is closed before an NMR measurement is conducted.

Figure 11:
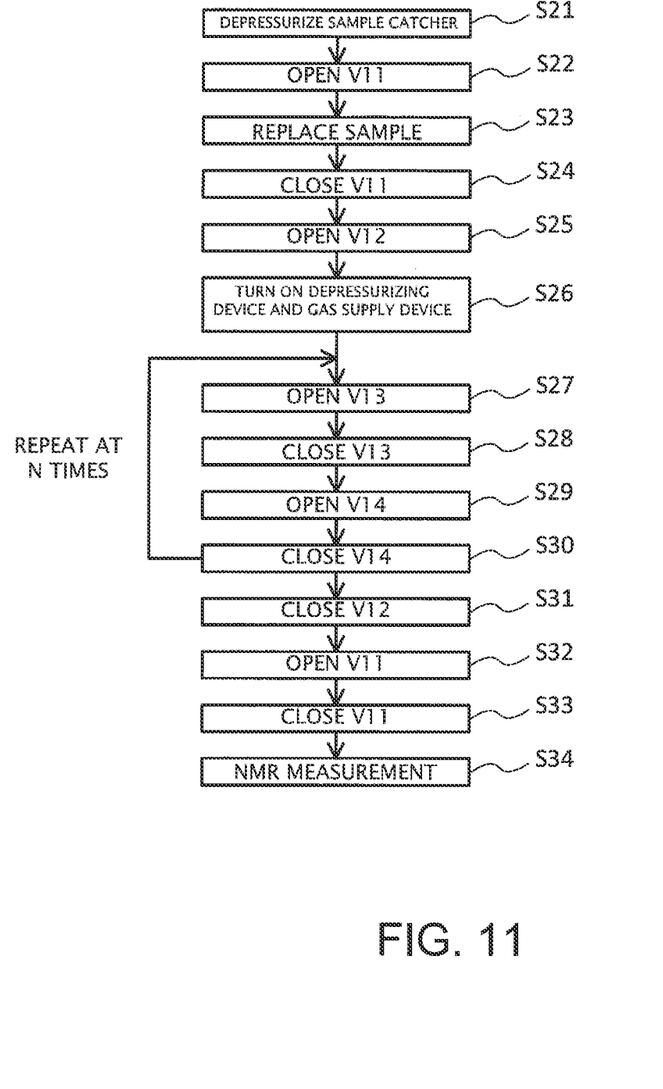
FIG. 11 is a flowchart of the operation of the NMR apparatus according to the fifth embodiment.

Referring to FIG. 11, the operation of the NMR apparatus 10D to be executed to replace the sample will be described. FIG. 11 is a flowchart of the operation for replacing the sample.

In sample replacement, the sample catcher 44 is depressurized (S21). For example, the valves V12, V13 are opened, and the sample catcher 44 is depressurized by the depressurizing device 20. After the depressurization, the valves V12, V13 are closed.

Then, the valve V11 is opened (S22). While the valve V11 is kept open, the sample tube 48 is taken out from the inside of the NMR probe 16 to be moved to the sample catcher 44 to replace the sample (S23). As replacement of the sample leaves some air in the sample catcher 44, the gas replacement will be conducted as described below to expel the air.

Initially, the valve V11 is closed (S24), and the valve V12 is open (S25). Opening and closing of the valves V11, V12 may be executed with the control device 24 or by an operator.

Thereafter, the depressurizing device 20 and the gas supply device 22 are turned on (S26). For example, the control device 24 turns on the depressurizing device 20 and the gas supply device 22 in response to an instruction from an operator.

Thereafter, the control device 24 opens the valve V13, with the valve V14 kept closed (S27), so that the sample catcher 44 is depressurized by the depressurizing device 20. The depressurization is continued until the pressure P1 measured on the pressure gauge P1 becomes equal to the target pressure Pa. The target pressure Pa is set in advance by an operator or the like.

When the pressure P1 measured on the pressure gauge P1 becomes equal to the target pressure Pa, the control device 24 closes the valve V13 (S28).

Thereafter, the control device 24 opens the valve V14, with the valve V13 kept closed (S29), so that gas is supplied into the sample catcher 44 from the gas supply device 22. The pressurization is continued until the pressure P2 measured on the pressure gauge P2 becomes equal to the target pressure Pb. The target pressure Pb is set in advance by an operator or the like.

When the pressure P2 measured on the pressure gauge P2 becomes equal to the target pressure Pb, the control device 24 closes the valve V14 (S30).

The control device 24 repeats the operation in steps S27 to S30 N times. That is, the control device 24 alternately repeats depressurization and pressurization N times. Note that N may or may not be set by an operator or the like, may be set in advance, or may be calculated and set based on a target pressure for the sample catcher 44.

After N-time repetition of the operation in steps S27 to S30, the control device 24 closes the valve V12 (S31).

The valve V11 is then opened for an NMR measurement (S32), and the sample tube 48 holding a replaced sample therein is returned from the sample catcher 44 into the NMR probe 16.

With the sample tube 48 set back in the NMR probe 16, the valve V11 is closed (S33).

Thereafter, the NMR apparatus 10D executes an NMR measurement (S34).

In the manner described above, the gas in the sample catcher 44 is replaced after a sample replacement. In the fifth embodiment, it is unnecessary to remove the NMR probe 16 from the static magnetic field generation device 12 for sample replacement because collection and introduction of a sample tube are performed using the sample catcher 44.

Similar to the first embodiment, also in the fifth embodiment pressure is controlled such that the pressure P1 satisfies the condition expressed by Expression (1) and the pressure P2 satisfies the condition expressed by Expression (2). The percentage of the amount of air remaining in the sample catcher 44 is expressed by Expression (3). Similar to the first embodiment, depressurization and pressurization are repetitively applied until the value obtained with Expression (3) falls to or below 1%, 0.1%, or 0.01%, for example.

Specifically, a gas chromatography or an oxygen densitometer is connected to the point M in FIG. 9 to measure the percentage of the actual amount of remaining air (for example, nitrogen gas or oxygen gas), and depressurization and pressurization may be repetitively applied until the measured result becomes equal to the target value.

In the fifth embodiment, the depressurizing device 20 may depressurize the NMR probe 16 when collecting the sample tube 48 from the NMR probe 16, to thereby suction the sample tube 48 in the NMR probe 16 up towards the sample catcher 44. Further, the gas supply device 22 may pressurize the NMR probe 16 when introducing the sample tube 48 back into the NMR probe 16, to thereby assist introduction of the sample tube 48 back into the NMR probe 16.

According to the above-described first to fifth embodiments, the air (for example, nitrogen gas or oxygen gas) introduced into the device when replacing the sample tube can be replaced with gas for use in NMR measurement. Specifically, for example, the air introduced into the NMR probe 16 or the sample catcher 44 during replacing of the sample can be replaced with gas for use in NMR measurement. This can prevent clogging of the pipe for supplying gas for rotating the sample tube and the pipe for supplying gas for bearing the sample tube when the NMR apparatus is used under low temperature. That is, it is possible to prevent clogging in the rotation mechanism for rotating a sample tube due to replacement of the sample tube. This makes it possible to maintain stable conditions for NMR measurement.

Further, as it is unnecessary to expose the interior structure of the gas circulation device to air, loss of gas due to such exposure can be prevented.

Further, use of a sample catcher to replace a sample tube, as in the fifth embodiment, enables replacement of the sample without exposing the NMR probe 16 to air. Further, it is unnecessary to equalize the temperature inside the NMR probe 16 to the room temperature when exchanging samples.

The invention claimed is:

1. An NMR apparatus, comprising:
   an NMR probe configured to hold a sample therein, the NMR probe being configured to be used under low temperature;
   a depressurizing device configured to depressurize the NMR probe;
   a gas supply device configured to supply gas into the NMR probe to thereby pressurize the NMR probe; and
   a control device configured to control depressurization using the depressurizing device and pressurization using the gas supply device,
   wherein
   the control device alternately repeats depressurization of the NMR probe using the depressurizing device, and pressurization of the NMR probe using the gas supply device before blowing a cooling gas into the NMR probe and until a percentage of an amount of air remaining in the NMR probe after replacement with the gas from the gas supply device becomes equal to a target value.

2. The NMR apparatus according to claim 1, wherein the control device alternately repeats the depressurization and the pressurization within a range of a pressure resistance of the NMR probe.

3. The NMR apparatus according to claim 1, wherein, provided that an air pressure is P0, a pressure in the NMR probe in the depressurization is P1, a pressure in the NMR probe in the pressurization is P2, and a number of times the depressurization and the pressurization are repeated is N, the target value is defined as $\{(P1/P0)(P0/P2)\}^N \times 100\%$.

4. The NMR apparatus according to claim 1, further comprising:
   a first buffer tank disposed between the depressurizing device and the NMR probe; and
   a second buffer tank disposed between the gas supply device and the NMR probe,
   wherein
   for the depressurization, the control device depressurizes the first buffer tank and further depressurizes the NMR probe, utilizing depressurization of the first buffer tank, and, for pressurization, the control device pressurizes the second buffer tank and further pressurizes the NMR probe, utilizing pressurization of the second buffer tank.

5. The NMR apparatus according to claim 1, wherein the gas to be supplied by the gas supply device is of an identical type with a gas to be supplied into the NMR probe in an NMR measurement.

6. A gas replacement method for replacing gas in an NMR probe, comprising the steps of:
   depressurizing an NMR probe that holds a sample therein and is set in an NMR apparatus, the NMR probe being configured to be used under low temperature;
   supplying gas from a gas supply device into the NMR probe after depressurization to thereby pressurize the NMR probe; and
   alternately repeating the depressurization and pressurization before blowing a cooling gas into the NMR probe to thereby replace gas in the NMR probe until a percentage of an amount of air remaining in the NMR probe after replacement with the gas from the gas supply device becomes equal to a target value.

* * * * *